United States Patent
Chen et al.

(10) Patent No.: US 11,855,083 B2
(45) Date of Patent: Dec. 26, 2023

(54) GATE STRUCTURE, FIN FIELD-EFFECT TRANSISTOR, AND METHOD OF MANUFACTURING FIN-FIELD EFFECT TRANSISTOR

(71) Applicant: Taiwan Semiconductor Manufacturing Company, Ltd., Hsinchu (TW)

(72) Inventors: Ji-Cheng Chen, Hsinchu (TW); Ching-Hwanq Su, Tainan (TW); Kuan-Ting Liu, Hsinchu (TW); Shih-Hang Chiu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 6 days.

(21) Appl. No.: 17/666,556

(22) Filed: Feb. 8, 2022

(65) Prior Publication Data
US 2022/0165728 A1 May 26, 2022

Related U.S. Application Data

(63) Continuation of application No. 15/957,912, filed on Apr. 20, 2018, now Pat. No. 11,270,994.

(51) Int. Cl.
| | |
|---|---|
| *H01L 27/088* | (2006.01) |
| *H01L 29/49* | (2006.01) |
| *H01L 29/423* | (2006.01) |
| *H01L 29/06* | (2006.01) |
| *H01L 21/8234* | (2006.01) |
| *H01L 21/762* | (2006.01) |
| *H01L 29/66* | (2006.01) |
| *H01L 21/28* | (2006.01) |
| *H01L 21/02* | (2006.01) |

(Continued)

(52) U.S. Cl.
CPC .... *H01L 27/0886* (2013.01); *H01L 21/02205* (2013.01); *H01L 21/02211* (2013.01); *H01L 21/28088* (2013.01); *H01L 21/28556* (2013.01); *H01L 21/76224* (2013.01); *H01L 21/823431* (2013.01); *H01L 21/823437* (2013.01); *H01L 21/823462* (2013.01); *H01L 21/823481* (2013.01); *H01L 29/0649* (2013.01); *H01L 29/42372* (2013.01); *H01L 29/4966* (2013.01); *H01L 29/513* (2013.01); *H01L 29/66545* (2013.01); *H01L 21/0262* (2013.01); *H01L 21/02532* (2013.01); *H01L 21/02579* (2013.01); *H01L 21/31053* (2013.01); *H01L 29/517* (2013.01); *H01L 29/7848* (2013.01)

(58) Field of Classification Search
None
See application file for complete search history.

(56) References Cited

U.S. PATENT DOCUMENTS

| | | | | |
|---|---|---|---|---|
| 2004/0038525 A1* | 2/2004 | Meng | ............... | H01L 21/28185 257/E21.171 |
| 2015/0279680 A1* | 10/2015 | Kashefi | ............... | H01L 29/4966 438/592 |
| 2016/0181412 A1* | 6/2016 | Kwon | ............... | H01L 21/28088 257/288 |

* cited by examiner

*Primary Examiner* — Evren Seven
(74) *Attorney, Agent, or Firm* — JCIPRNET

(57) ABSTRACT

A gate structure includes a gate dielectric layer, a work function layer, a metal layer, and a barrier layer. The work function layer is surrounded by the gate dielectric layer. The metal layer is disposed over the work function layer. The barrier layer is surrounded by the work function layer and surrounds the metal layer. The barrier layer includes fluorine and silicon, or fluorine and aluminum. The barrier layer is a tri-layered structure.

13 Claims, 16 Drawing Sheets

(51) Int. Cl.
*H01L 21/285* (2006.01)
*H01L 29/51* (2006.01)
*H01L 21/3105* (2006.01)
*H01L 29/78* (2006.01)

GATE STRUCTURE, FIN FIELD-EFFECT TRANSISTOR, AND METHOD OF MANUFACTURING FIN-FIELD EFFECT TRANSISTOR

CROSS-REFERENCE TO RELATED APPLICATION

This application is a continuation application of and claims the priority benefit of a prior application Ser. No. 15/957,912, filed on Apr. 20, 2018. The entirety of the above-mentioned patent application is hereby incorporated by reference herein and made a part of this specification.

BACKGROUND

As the semiconductor industry has progressed into nanometer technology, process nodes in pursuit of higher device density, higher performance, and lower costs came to play significant roles in the fabrication process of the device. Challenges from both fabrication and design issues have resulted in the development of three-dimensional designs (such as a fin field-effect transistor (FinFET)) and the use of a metal gate structure with a high-k (dielectric constant) material. The metal gate structure is often manufactured by using gate replacement technologies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
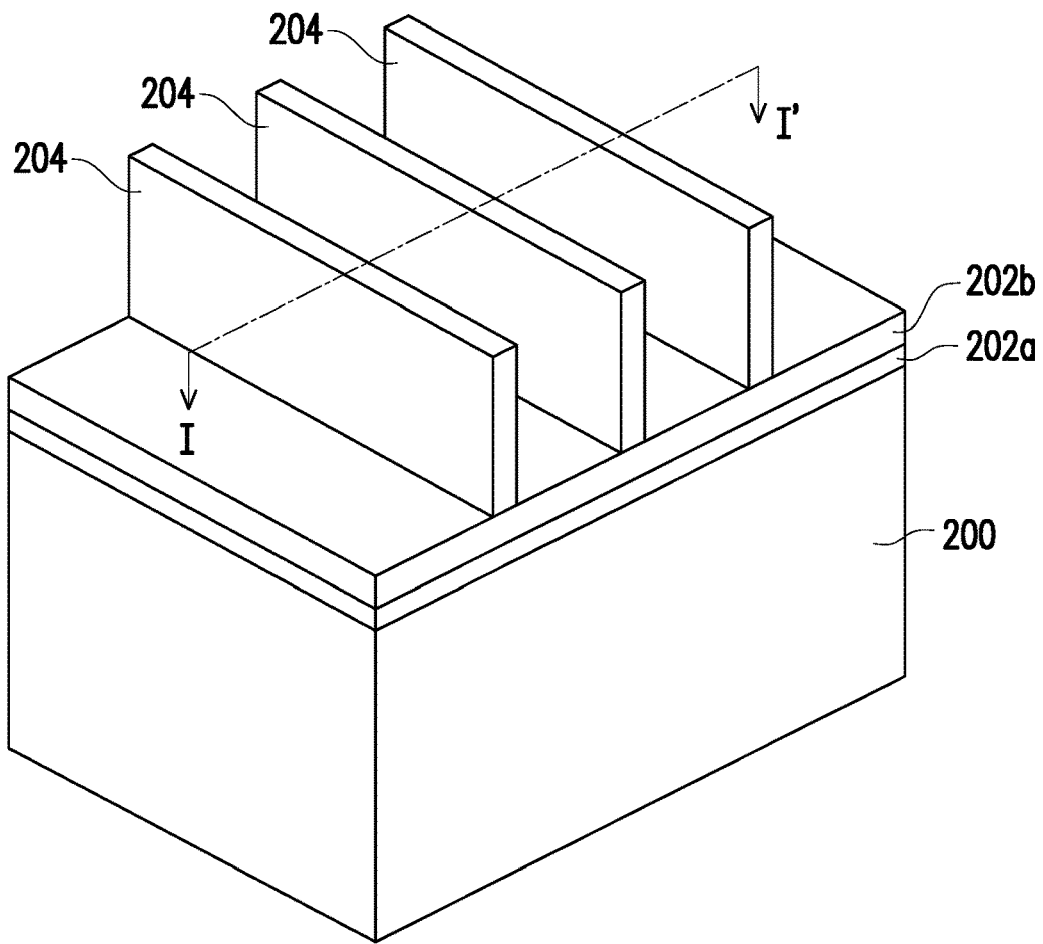
FIG. 1A to FIG. 1K are perspective views illustrating a method for manufacturing a FinFET in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The embodiments of the disclosure describe the exemplary manufacturing process of FinFETs and the FinFETs fabricated there-from. The FinFET may be formed on bulk silicon substrates in certain embodiments of the disclosure. Still, the FinFET may be formed on a silicon-on-insulator (SOI) substrate, a germanium-on-insulator (GOI) substrate, a SiGe substrate, or a Group III-V semiconductor substrate as alternatives. Also, in accordance with some embodiments, the silicon substrate may include other conductive layers or other semiconductor elements, such as transistors, diodes or the like. The embodiments are not limited in this context.

Figure 2A:
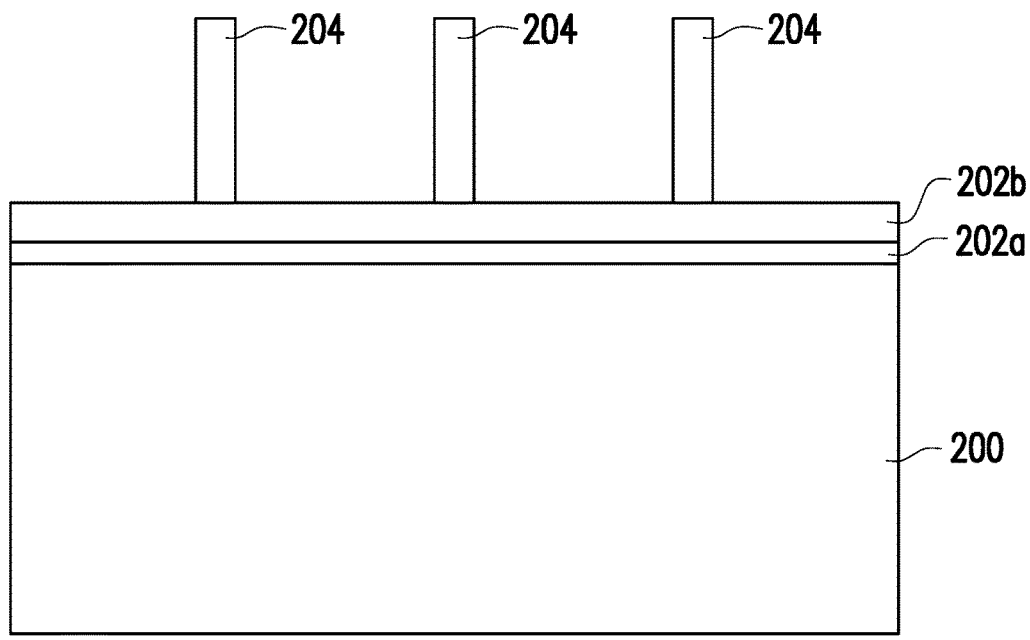
FIG. 2A to FIG. 2K are cross-sectional views illustrating the method for manufacturing the FinFET in FIG. 1A to FIG. 1K.

FIG. 1A is a perspective view of the FinFET 10 at one of various stages of the manufacturing method and FIG. 2A is a cross-sectional view of the FinFET 10 taken along the line I-I' of FIG. 1A. Referring to FIG. 1A and FIG. 2A, a semiconductor substrate 200 is provided. In some embodiments, the semiconductor substrate 200 includes a crystalline silicon substrate (e.g., wafer). The semiconductor substrate 200 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively, configured for a p-type FinFET. In some alternative embodiments, the semiconductor substrate 200 may be made of a suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, a pad layer 202a and a mask layer 202b are sequentially formed on the semiconductor substrate 200. The pad layer 202a may be a silicon oxide thin film formed by, for example, a thermal oxidation process. The pad layer 202a may act as an adhesion layer between the semiconductor substrate 200 and the mask layer 202b. The pad layer 202a may also act as an etch stop layer for etching the mask layer 202b. In some embodiments, the mask layer 202b may be a silicon nitride layer formed by low-pressure chemical vapor deposition (LPCVD) or plasma enhanced chemical vapor deposition (PECVD). The mask layer 202b is used as a hard mask during subsequent photolithography processes. A patterned photoresist layer 204 having a pre-determined pattern is formed on the mask layer 202b.

Figure 1B:
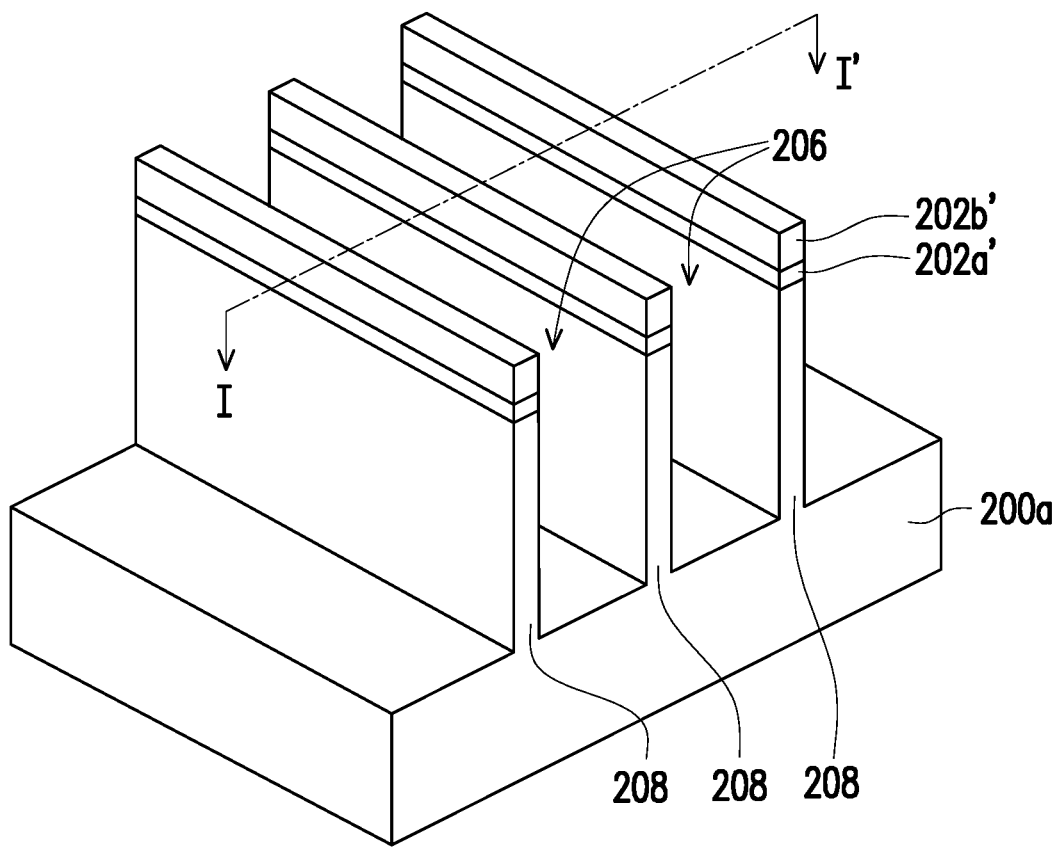
Figure 2B:
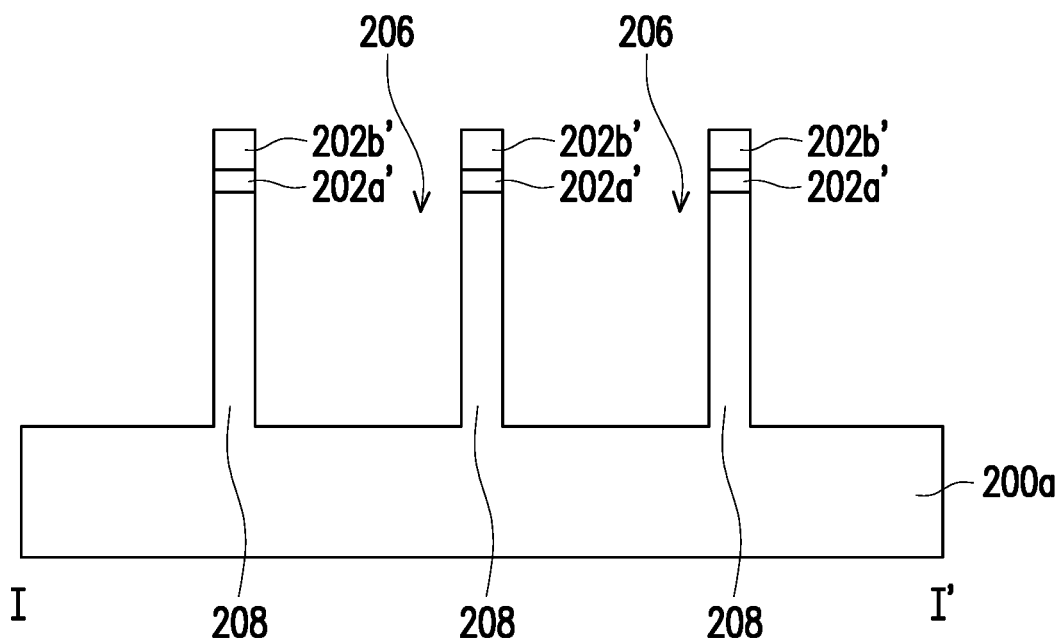

FIG. 1B is a perspective view of the FinFET 10 at one of various stages of the manufacturing method and FIG. 2B is a cross-sectional view of the FinFET 10 taken along the line I-I' of FIG. 1B. Referring to FIGS. 1A-1B and FIGS. 2A-2B, the mask layer 202b and the pad layer 202a which are not covered by the patterned photoresist layer 204 are sequentially etched to form a patterned mask layer 202b' and a patterned pad layer 202a'. The patterned mask layer 202b' and the patterned pad layer 202a' expose underlying semiconductor substrate 200. By using the patterned mask layer 202b', the patterned pad layer 202a', and the patterned photoresist layer 204 as a mask, portions of the semiconductor substrate 200 are exposed and etched to form a plurality of trenches 206 and a plurality of semiconductor fins 208 between the trenches 206. The semiconductor fins 208 are covered by the patterned mask layer 202b', the patterned pad layer 202a', and the patterned photoresist layer 204. Two adjacent trenches 206 are spaced apart by a spacing. For example, the spacing between trenches 206 may be smaller than about 30 nm. In some embodiments, two adjacent trenches 206 are spaced apart by a corresponding semiconductor fin 208.

In some embodiments, a height of the semiconductor fins 208 and a depth of the trench 206 may range from about 5 nm to about 500 nm. After the trenches 206 and the semiconductor fins 208 are formed, the patterned photoresist layer 204 is then removed. In some embodiments, a cleaning process may be performed to remove a native oxide of the semiconductor substrate 200a and the semiconductor fins 208. The cleaning process may be performed using diluted hydrofluoric (DHF) acid or other suitable cleaning solutions.

Figure 1C:
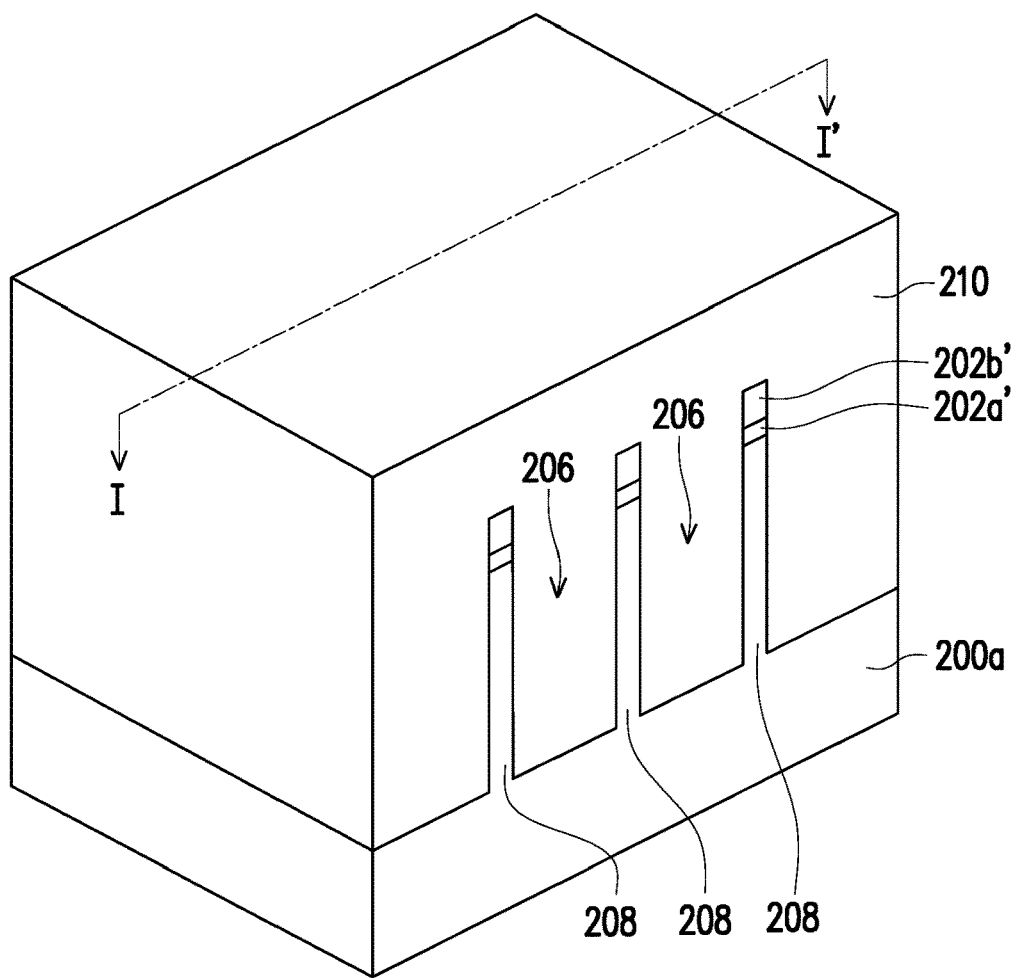
Figure 2C:
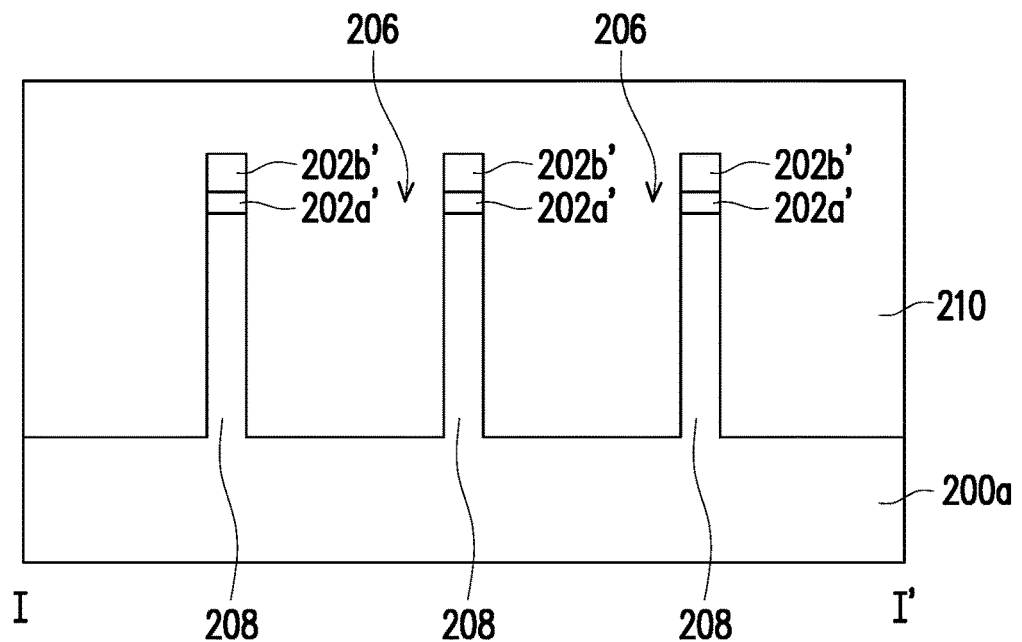

FIG. 1C is a perspective view of the FinFET 10 at one of various stages of the manufacturing method and FIG. 2C is a cross-sectional view of the FinFET 10 taken along the line I-I' of FIG. 1C. Referring to in FIG. 1C and FIG. 2C, an insulating material 210 is formed over the semiconductor substrate 200a to cover the semiconductor fins 208 and to fill up the trenches 206. In addition to the semiconductor fins 208, the insulating material 210 further covers the patterned pad layer 202a' and the patterned mask layer 202b'. The insulating material 210 may include silicon oxide, silicon nitride, silicon oxynitride, a spin-on dielectric material, or a low-k dielectric material. It should be noted that the low-k dielectric materials are generally dielectric materials having a dielectric constant lower than 3.9. The insulating material 210 may be formed by high-density-plasma chemical vapor deposition (HDP-CVD), sub-atmospheric CVD (SACVD), or spin on.

Figure 1D:
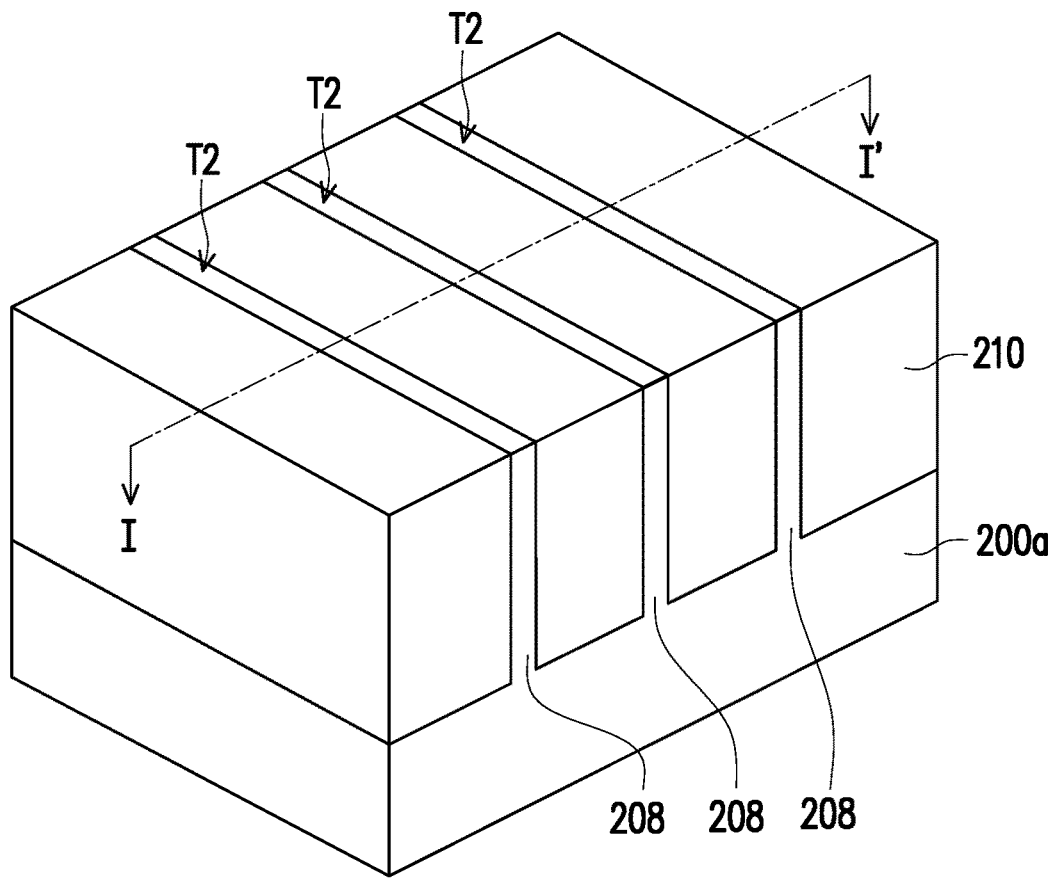
Figure 2D:
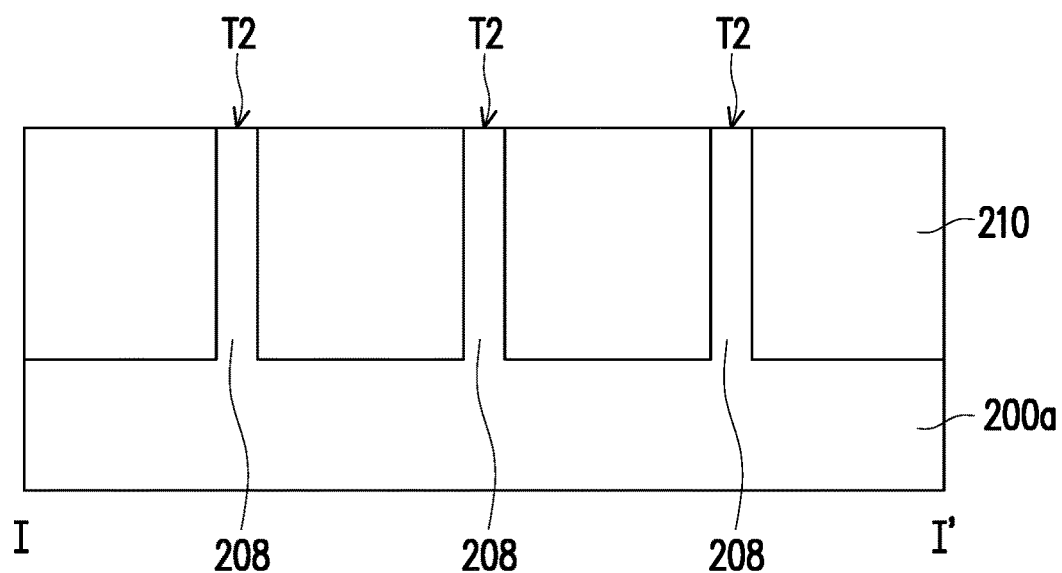

FIG. 1D is a perspective view of the FinFET 10 at one of various stages of the manufacturing method and FIG. 2D is a cross-sectional view of the FinFET 10 taken along the line I-I' of FIG. 1D. Referring to FIGS. 1C-1D and FIGS. 2C-2D, a chemical mechanical polish (CMP) process and a wet etching process may be performed to remove a portion of the insulating material 210, the patterned mask layer 202b' and the patterned pad layer 202a' until the semiconductor fins 208 are exposed. As illustrated in FIG. 1D and FIG. 2D, after the insulating material 210 is polished, top surface of the polished insulating material 210 is substantially coplanar with top surfaces T2 of the semiconductor fins 208.

Figure 1E:
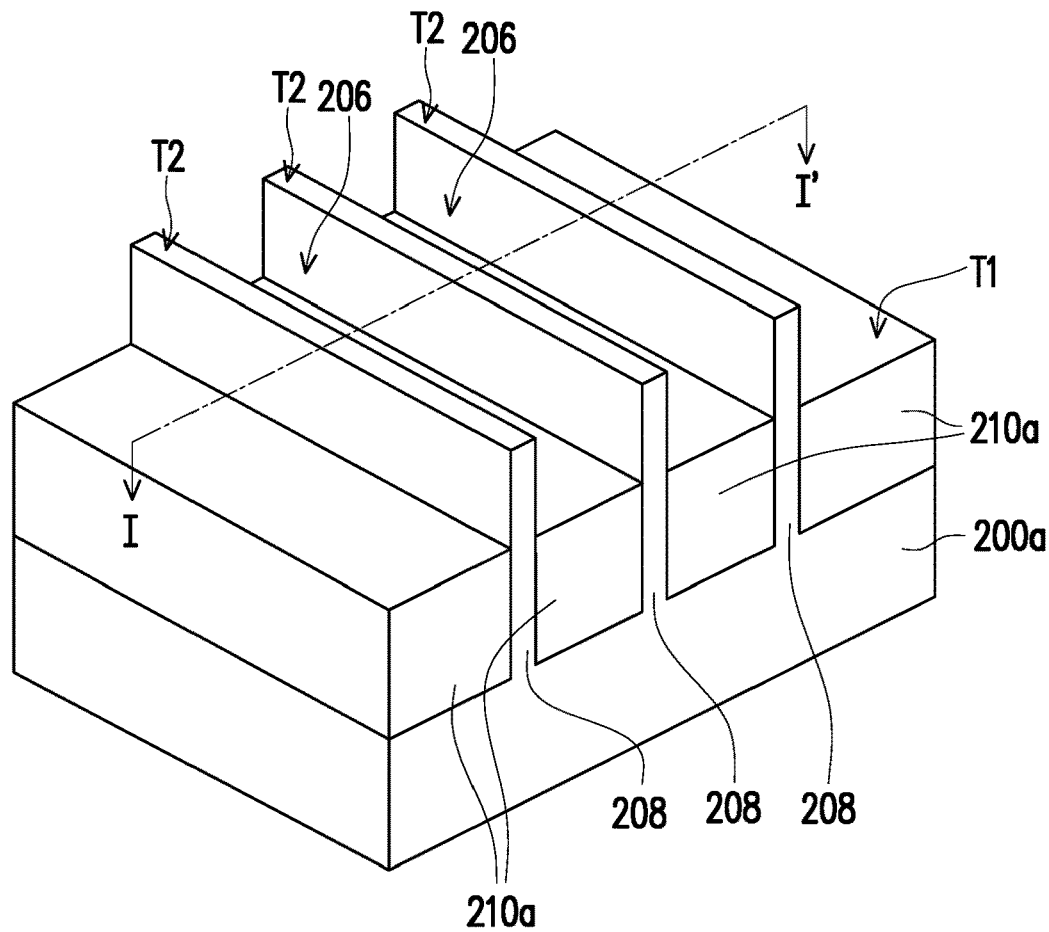
Figure 2E:
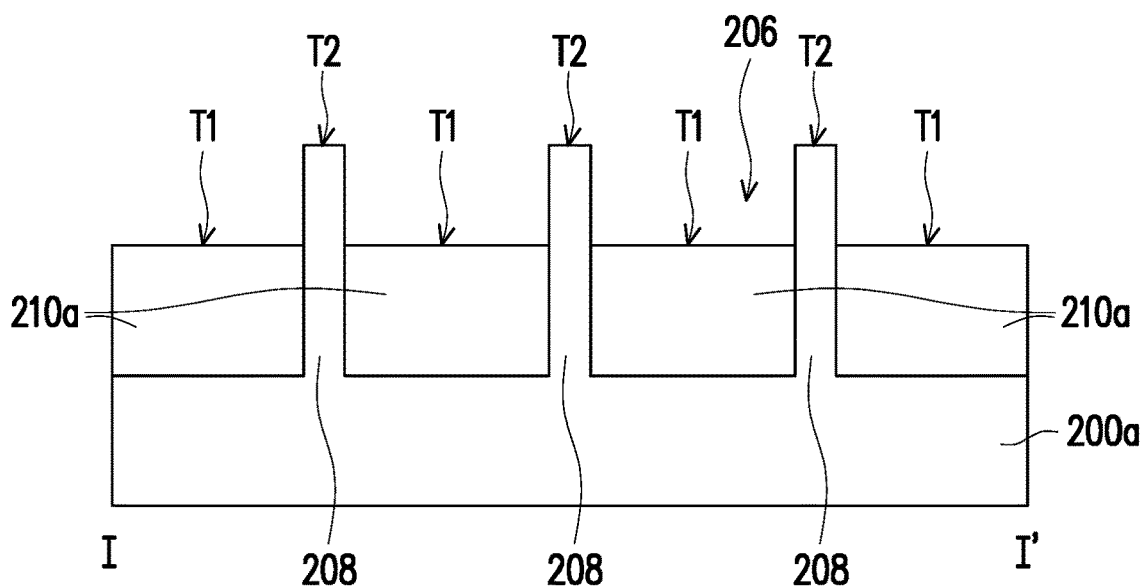

FIG. 1E is a perspective view of the FinFET 10 at one of various stages of the manufacturing method and FIG. 2E is a cross-sectional view of the FinFET 10 taken along the line I-I' of FIG. 1E. Referring to FIGS. 1D-1E and FIGS. 2D-2E, the polished insulating material 210 filled in the trenches 206 is partially removed by an etching process to form a plurality of insulators 210a. In some embodiments, the insulators 210a are formed on the semiconductor substrate 200a and each of the semiconductor fins 208 is sandwiched between two adjacent insulators 210a. In some embodiments, the etching process may be a wet etching process with hydrofluoric acid (HF) or a dry etching process. The top surfaces T1 of the insulators 210a are lower than the top surfaces T2 of the semiconductor fins 208. For example, the semiconductor fins 208 may protrude from the top surfaces T1 of the insulators 210a. In some embodiments, a height difference between the top surfaces T2 of the semiconductor fins 208 and the top surfaces T1 of the insulators 210a ranges from about 15 nm to about 50 nm.

Figure 1F:
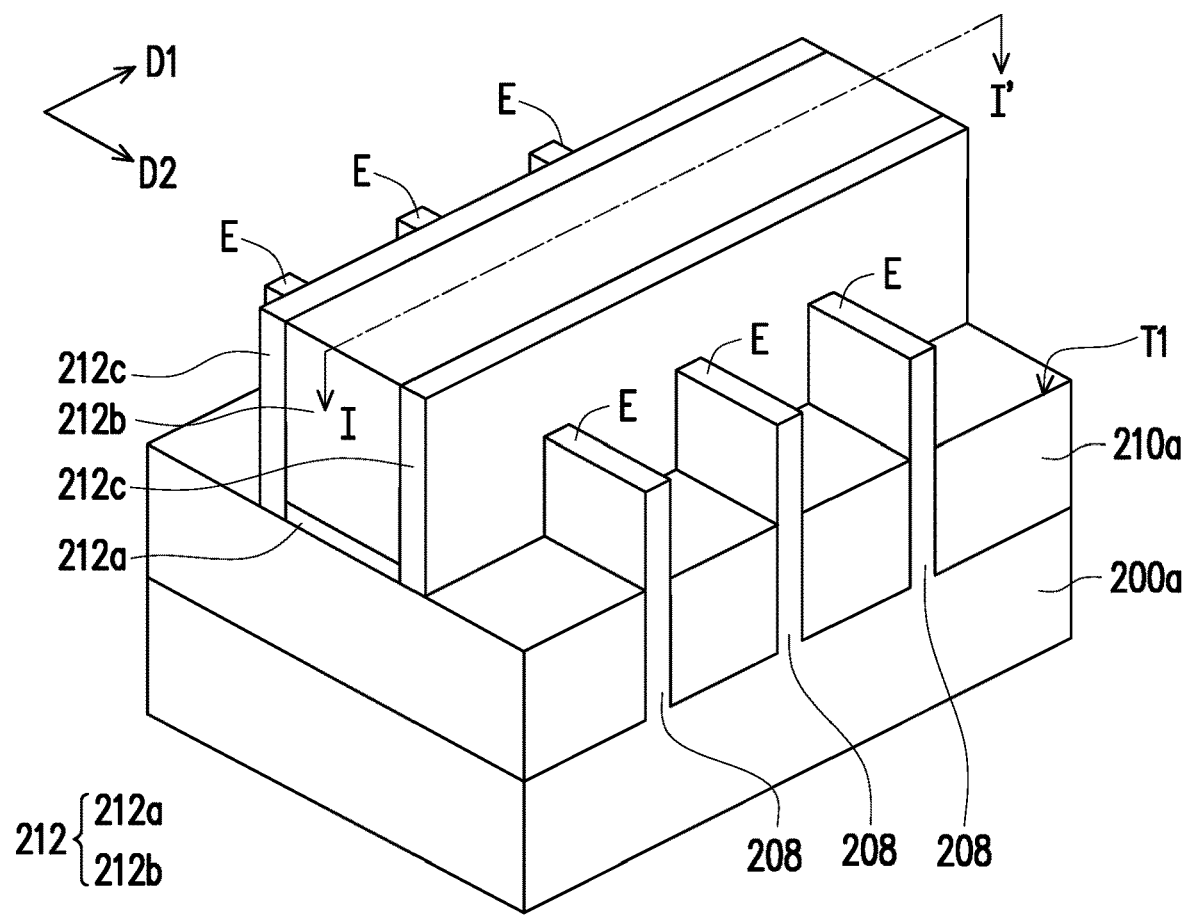
Figure 2F:
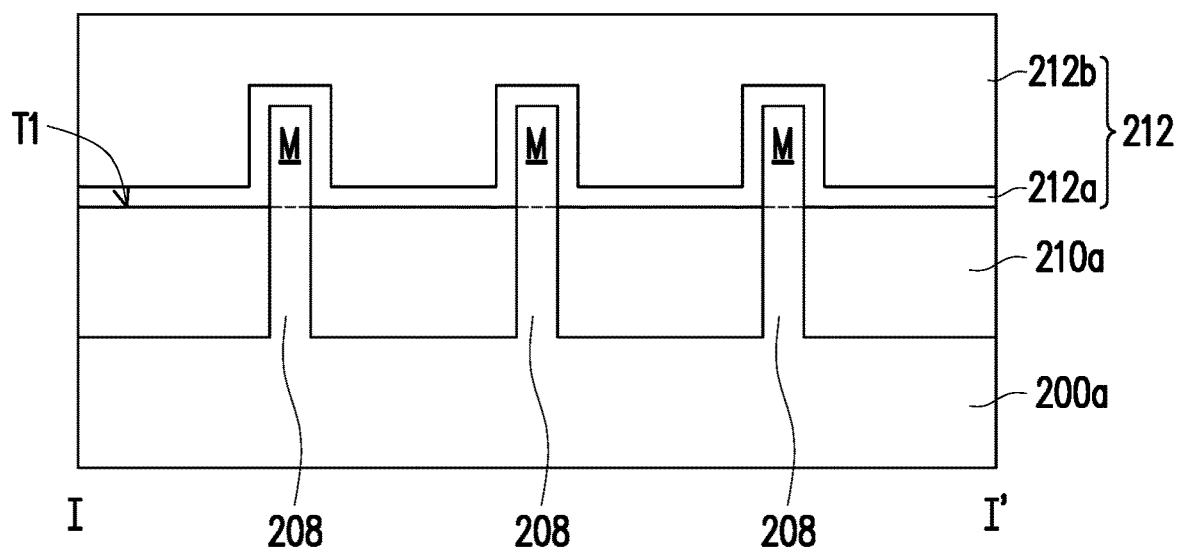

FIG. 1F is a perspective view of the FinFET 10 at one of various stages of the manufacturing method and FIG. 2F is a cross-sectional view of the FinFET 10 taken along the line I-I' of FIG. 1F. Referring to FIG. 1F and FIG. 2F, a dummy gate structure 212 is formed over portions of the semiconductor fins 208 and portion of the insulators 210a. In some embodiments, an extending direction D1 of the dummy gate structure 212 may be perpendicular to an extending direction D2 of the semiconductor fins 208, so as to cover the middle portions M (shown in FIG. 2F) of the semiconductor fins 208. In other words, the dummy gate structure 212 may be formed across the semiconductor fins 208.

In some embodiments, the dummy gate structure 212 includes a dummy gate dielectric layer 212a and a dummy gate 212b disposed over the dummy gate dielectric layer 212a. In some embodiments, the dummy gate dielectric layer 212a is formed to separate the semiconductor fins 208 and the dummy gate 212b and to function as an etch stop layer. The dummy gate dielectric layer 212a may include, for example, silicon oxide, silicon nitride, or silicon oxynitride. In some embodiments, the dummy gate dielectric layer 212a may be formed using a suitable process such as atomic layer deposition (ALD), chemical vapor deposition (CVD), physical vapor deposition (PVD), thermal oxidation, UV-ozone oxidation, or combinations thereof. In some embodiments, the dummy gate 212b includes a silicon-containing material, such as poly-silicon, amorphous silicon, or a combination thereof. The dummy gate 212b may be formed using a suitable process, such as ALD, CVD, PVD, plating, or combinations thereof. It should be noted that the dummy gate 212b may be a single-layered structure or a multi-layered structure. In some embodiments, a thickness of the dummy gate 212b ranges between 30 nm and 90 nm.

In addition to the dummy gate structure 212, a pair of spacers 212c are also formed over portions of the semiconductor fins 208 and portion of the insulators 210a. As illustrated in FIG. 1F, the spacers 212c are disposed on sidewalls of the dummy gate structure 212. In some embodiments, the spacers 212c and the dummy gate structure 212 have the same extending direction D1. Similar to the dummy gate structure 212, the spacers 212c are also formed across the semiconductor fins 208. In some embodiments, the spacers 212c are formed of dielectric materials, such as silicon oxide, silicon nitride, carbonized silicon nitride (SiCN), SiCON, or a combination thereof. It should be noted that the spacers 212c may be a single-layered structure or a multi-layered structure. Referring to FIG. 1F, portions of the semiconductor fins 208 that are revealed by the dummy gate structure 212 and the spacers 212c are referred to as exposed portions E.

Figure 1G:
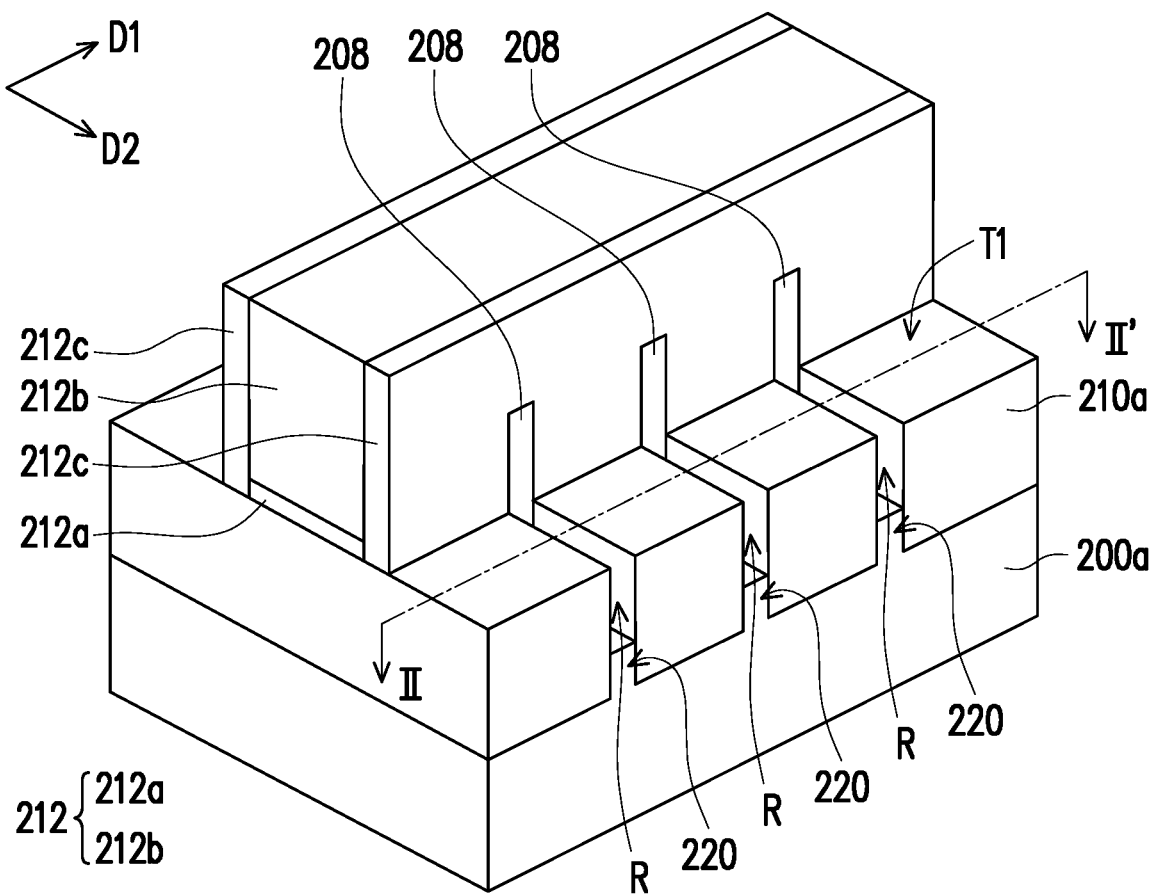
Figure 2G:
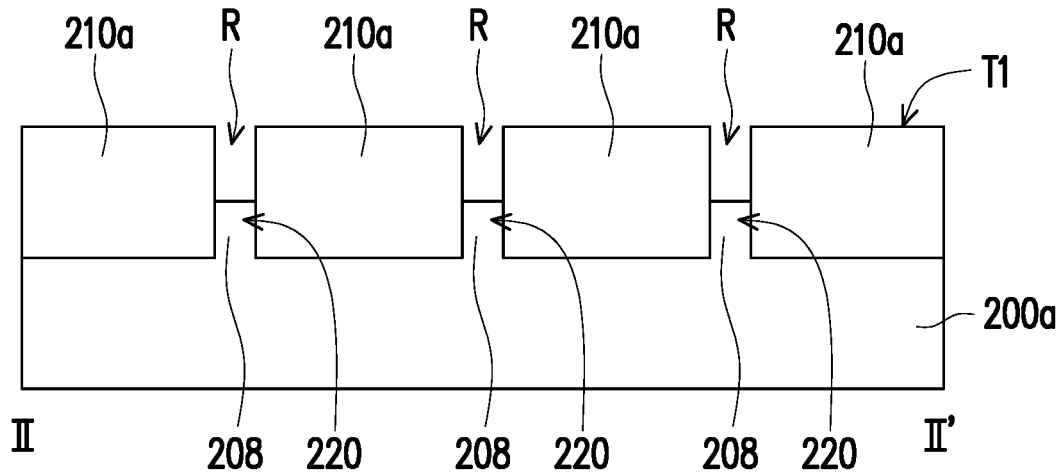

FIG. 1G is a perspective view of the FinFET 10 at one of various stages of the manufacturing method and FIG. 2G is a cross-sectional view of the FinFET 10 taken along the line II-II' of FIG. 1G. Referring to FIGS. 1F-1G and FIGS. 2F-2G, the exposed portions E of the semiconductor fins 208 are removed and recessed to formed recessed portions R. In some embodiments, the exposed portions E may be removed by an anisotropic etching process, an isotropic etching process, or a combination thereof. In some embodiments, the exposed portions E of the semiconductor fins 208 are recessed below the top surfaces T1 of the insulators 210a. The depth of the recessed portions R is less than the thickness of the insulators 210a. In other words, the exposed portions E of the semiconductor fins 208 are not entirely removed, and the remaining semiconductor fins 208 located in the recessed portion R may constitute source/drain regions 220 of the semiconductor fins 208. As show in FIG. 1G and FIG. 2G, portions of the semiconductor fins 208 covered by the dummy gate structure 212 and the spacers 212c are not removed when the exposed portions E of the semiconductor fins 208 are recessed. The portions of the semiconductor fins 208 covered by the dummy gate structure 212 and the spacers 212c are exposed at sidewalls of the spacers 212c. It should be noted that the recessing step illustrated in FIG. 1G and FIG. 2G may be omitted in some alternative embodiments.

Figure 1H:
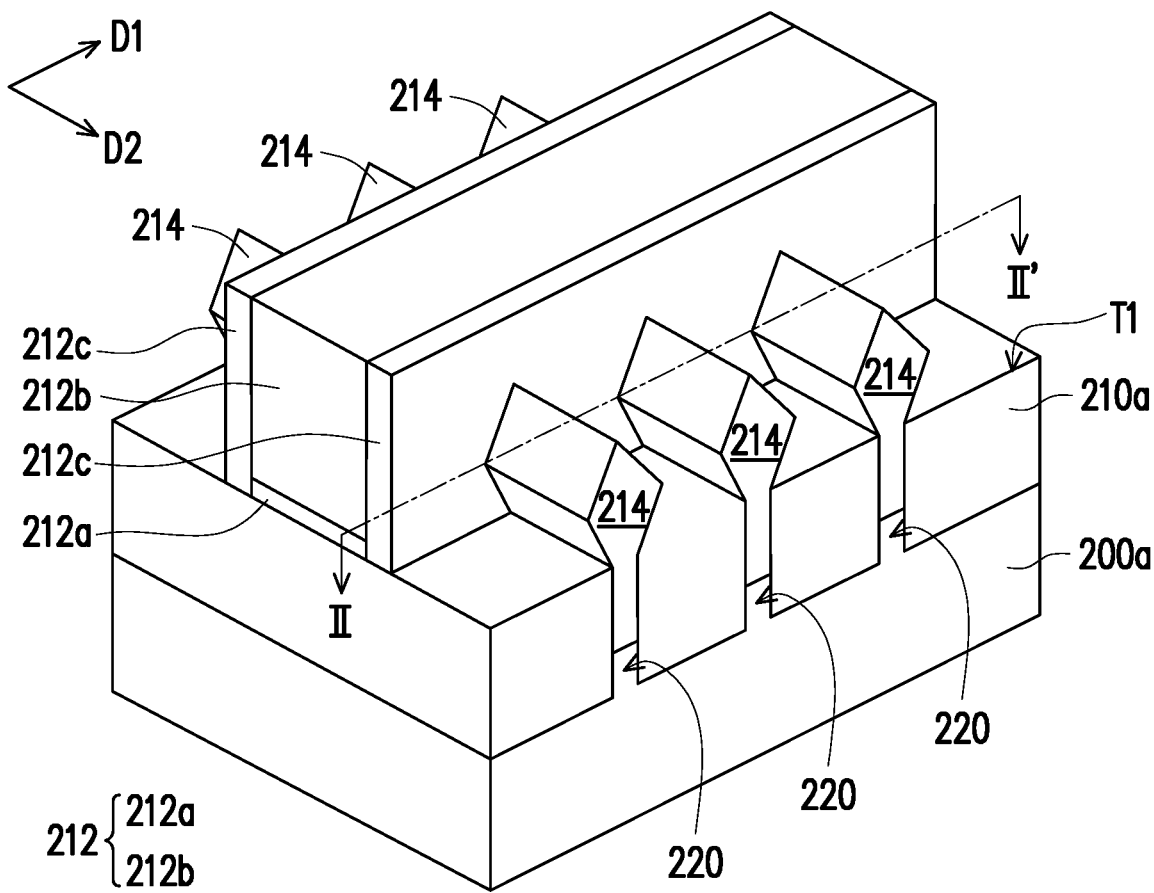
Figure 2H:
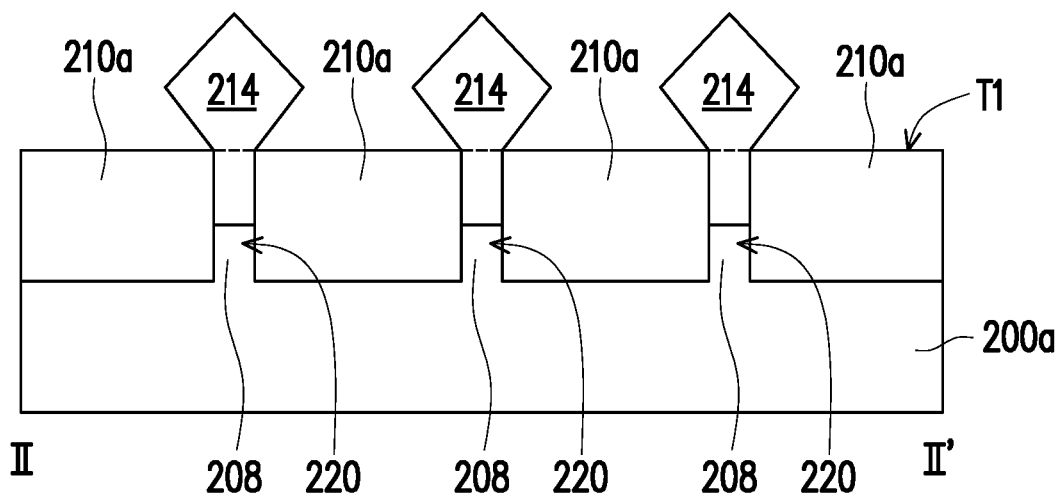

FIG. 1H is a perspective view of the FinFET 10 at one of various stages of the manufacturing method and FIG. 2H is a cross-sectional view of the FinFET 10 taken along the line II-II' of FIG. 1H. Referring to FIG. 1H and FIG. 2H, a strained material 214 (or a highly doped low resistance material) is grown over the recessed portions R of the semiconductor fin 208 and extends beyond the top surfaces T1 of the insulators 210a to strain or stress the semiconductor fins 208. In other words, the strained material 214 is formed over the source/drain regions 220 of the semiconductor fin 208. Thus, the strained material 214 includes a source disposed at a side of one of the spacers 212c and a drain disposed at a side of another one of the spacers 212c. The source covers an end of the semiconductor fins 208 while the drain covers the other end of the semiconductor fins 208.

In some embodiments, the strained material 214 may be doped with a conductive dopant. For example, the strained material 214, such as SiGe, may be epitaxial-grown with a p-type dopant for straining a p-type FinFET. That is, the strained material 214 is doped with the p-type dopant to be the source and the drain of the p-type FinFET. The p-type dopant includes boron or $BF_2$, and the strained material 214 may be epitaxial-grown by LPCVD process with in-situ doping. In some alternative embodiments, the strained material 214, such as SiC, SiP, a combination of SiC/SiP, or SiCP is epitaxial-grown with an n-type dopant for straining an n-type FinFET. That is, the strained material 214 is doped with the n-type dopant to be the source and the drain of the n-type FinFET. The n-type dopant includes arsenic and/or phosphorus, and the strained material 214 may be epitaxial-grown by LPCVD process with in-situ doping. It should be noted that the strained material 214 may be a single-layered structure or a multi-layer structure.

Figure 1I:
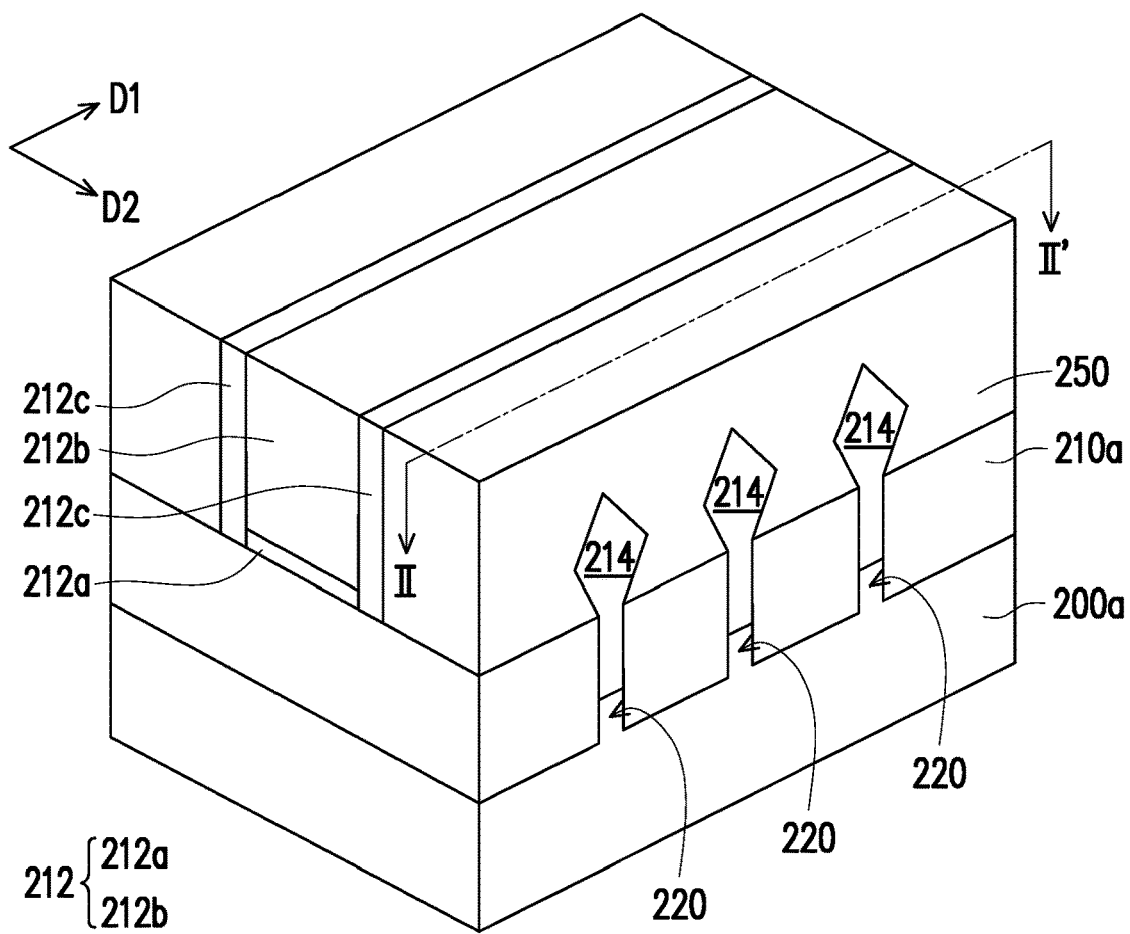
Figure 2I:
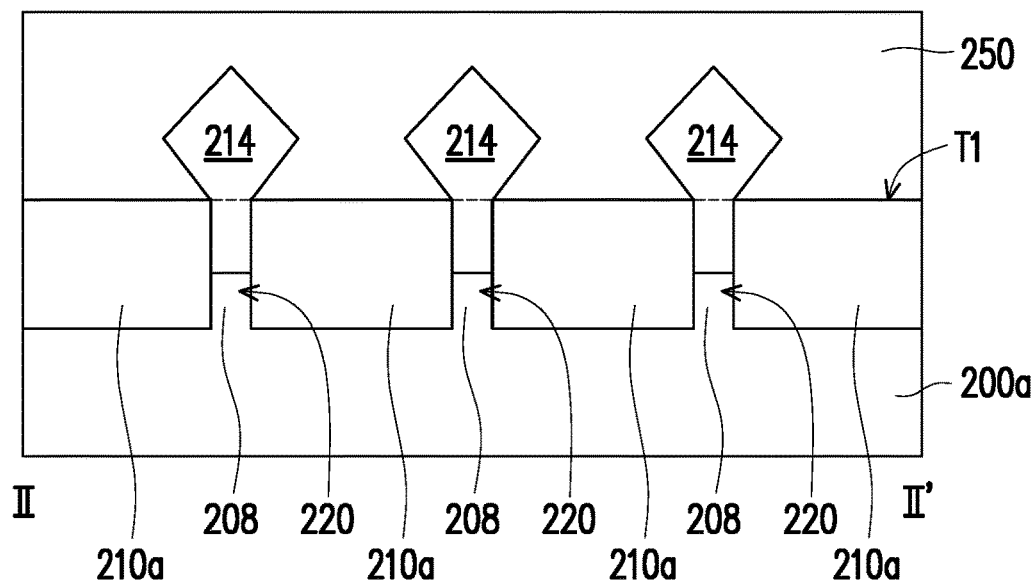

FIG. 1I is a perspective view of the FinFET 10 at one of various stages of the manufacturing method and FIG. 2I is a cross-sectional view of the FinFET 10 taken along the line II-II' of FIG. 1I. Referring to FIG. 1I and FIG. 2I, an interlayer dielectric layer 250 is formed over the strained material 214 and the insulators 210a. In other words, the interlayer dielectric layer 250 is formed adjacent to the spacers 212c. The interlayer dielectric layer 250 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the interlayer dielectric layer 250 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer 250 may include one or more dielectric materials and/or one or more dielectric layers. In some embodiments, the interlayer dielectric layer 250 is formed to a suitable thickness by Flowable CVD (FCVD), CVD, HDPCVD, SACVD, spin-on, sputtering, or other suitable methods. For example, an interlayer dielectric material layer (not shown) is initially formed to cover the insulators 210a, the dummy gate structure 212, and the spacers 212c. Subsequently, a thickness of the interlayer dielectric material layer is reduced until a top surface of the dummy gate structure 212 and top surfaces of the spacers 212c are exposed, so as to form the interlayer dielectric layer 250. The process of reducing the thickness of the interlayer dielectric material layer may be achieved by a chemical mechanical polishing (CMP) process, an etching process, or other suitable processes.

Figure 1J:
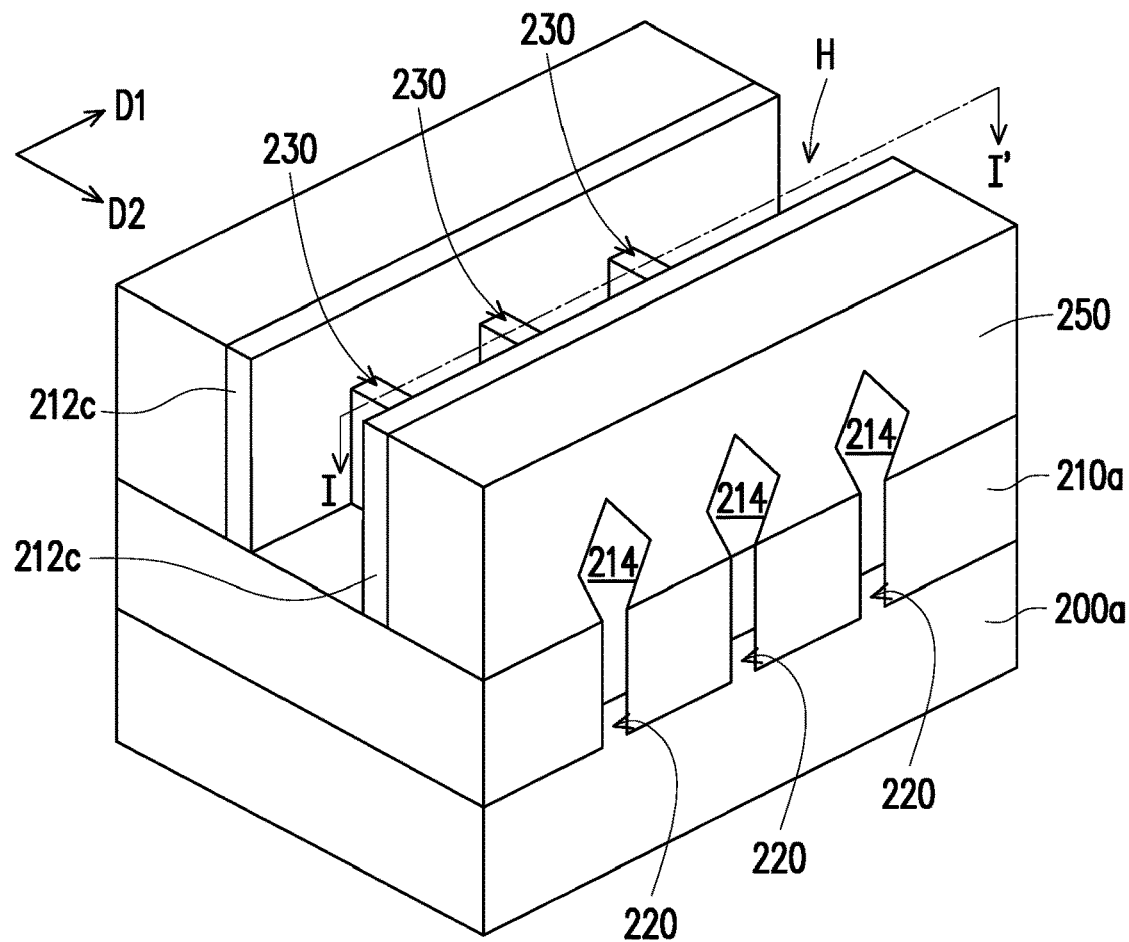
Figure 2J:
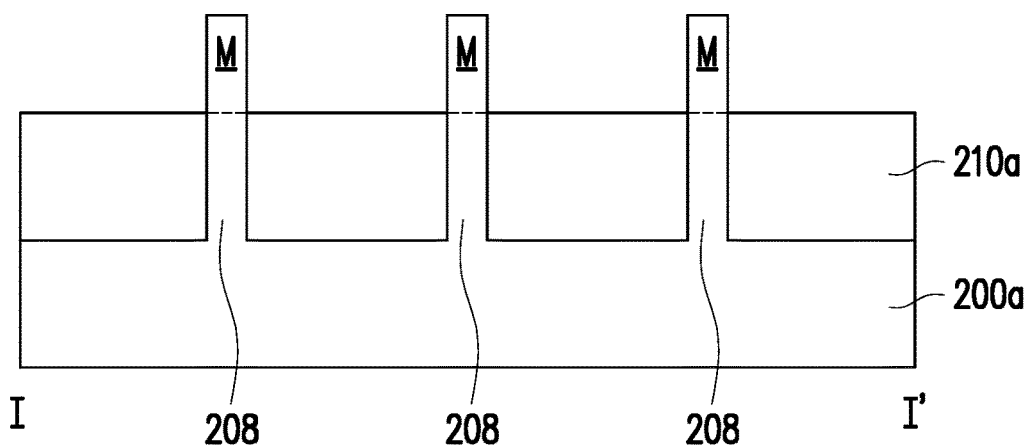

FIG. 1J is a perspective view of the FinFET 10 at one of various stages of the manufacturing method and FIG. 2J is a cross-sectional view of the FinFET 10 taken along the line I-I' of FIG. 1J. Referring to FIG. 1J and FIG. 2J, the dummy gate structure 212 is removed to form a hollow portion H exposing a portion of the semiconductor fins 208. For example, the dummy gate 212b and the dummy gate dielectric layer 212a are removed, and the hollow portion H exposes part of the middle portions M of the semiconductor fins 208. It should be noted that the semiconductor fins 208 exposed by the hollow portion H may act as a channel region 230 of the semiconductor fins 208. In some embodiments, the dummy gate 212b and the dummy gate dielectric layer 212a are removed through an etching process or other suitable processes. For example, the dummy gate 212b and the dummy gate dielectric layer 212a may be removed through a wet etching process or a dry etching process. Example of the wet etching process includes chemical etching and example of the dry etching process includes plasma etching. However, the disclosure is not limited thereto. Other commonly known etching method may also be adapted to remove the dummy gate 212b and the dummy gate dielectric layer 212a.

Figure 1K:
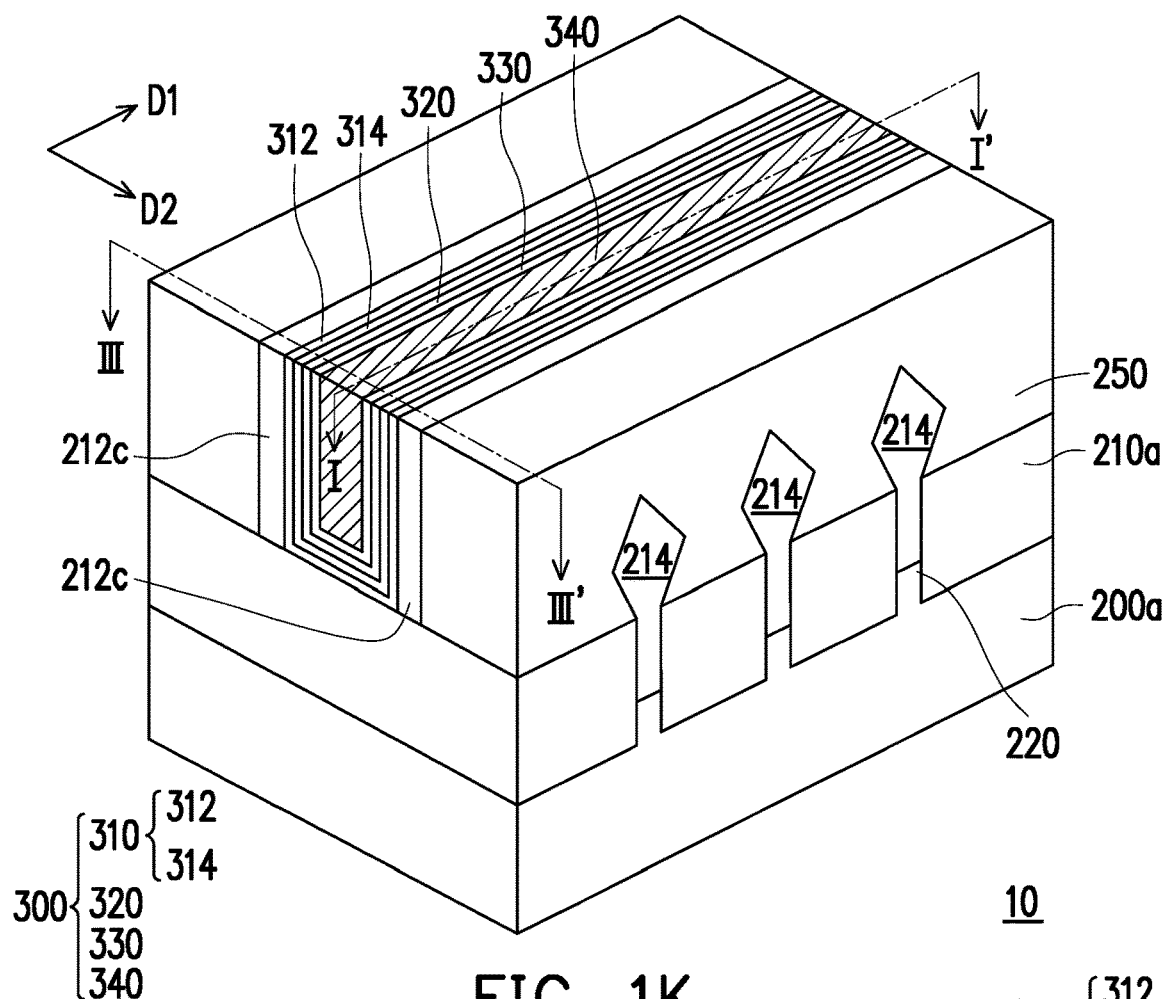
Figure 2K:
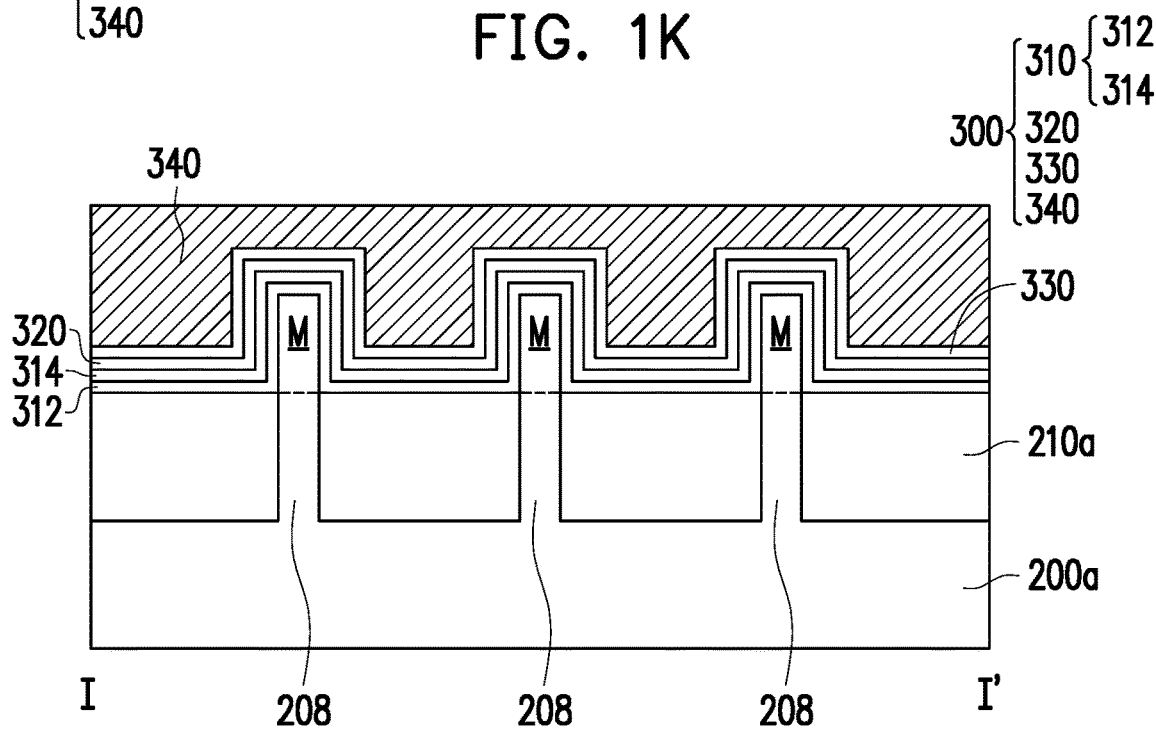

FIG. 1K is a perspective view of the FinFET 10 at one of various stages of the manufacturing method and FIG. 2K is a cross-sectional view of the FinFET 10 taken along the line I-II' of FIG. 1K. Referring to FIG. 1K and FIG. 2K, a gate dielectric layer 310, a work function layer 320, a barrier layer 330, and a metal layer 340 are sequentially deposited into the hollow portion H to form a gate structure 300, thereby obtaining the FinFET 10. In some embodiments, the gate dielectric layer 310 may be constituted by an interfacial oxide layer 312 and a high-k layer 314. As illustrated in FIG. 1K and FIG. 2K, the gate structure 300 is disposed across the semiconductor fins 208 and are sandwiched between the pair of spacers 212c. The process for forming the gate structure 300 will be described in detail below.

Figure 3A:
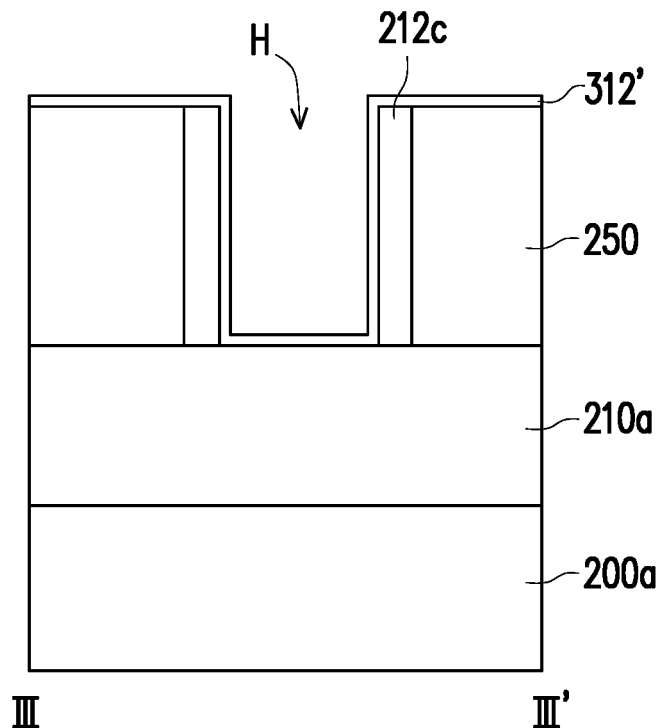
FIG. 3A to FIG. 3F are cross-sectional views illustrating the method for manufacturing a gate structure of the FinFET in FIG. 1K.

FIG. 3A to FIG. 3F are cross-sectional views illustrating the method for manufacturing the gate structure 300 of the FinFET 10 taken along the line III-III' of FIG. 1K. Referring to FIG. 3A, an interfacial oxide material layer 312' is formed over the interlayer dielectric layer 250, the spacers 212c, and the insulators 210a. For example, the interfacial oxide material layer 312' may extend into the hollow portion H to cover a bottom surface and sidewalls of the hollow portion H. The interfacial oxide material layer 312' may include a dielectric material such as silicon oxide layer ($SiO_2$) or silicon oxynitride (SiON). In some embodiments, the interfacial oxide material layer 312' may be formed by a deposition process such as atomic layer deposition (ALD), chemical vapor deposition (CVD), and/or other suitable deposition methods. In some alternative embodiments, the interfacial oxide material layer 312' may be formed on the exposed portion of the semiconductor substrate through an oxidation process. For example, the interfacial oxide material layer 312' may be formed by oxidizing the channel region 230 of the semiconductor fins 208 shown in FIG. 1J through chemical oxidation or thermal oxidation. When the interfacial oxide material layer 312' is formed by the oxidation process, the interfacial oxide material layer 312' may exhibit different profile from the illustration shown in FIGS. 1K, 2K, and 3A. In some embodiments, the interfacial oxide material layer 312' or the subsequently formed interfacial oxide layer 312 (shown in FIGS. 1K, FIG. 2K, and 3F) may be adapted to provide a good interface between the semiconductor surface (i.e., the semiconductor fins 208 illustrated in FIG. 2K) and the gate insulator (i.e., the high-k layer 314 illustrated in FIG. 2K) and to suppress the mobility degradation of the channel carrier of the FinFET 10.

Figure 3B:
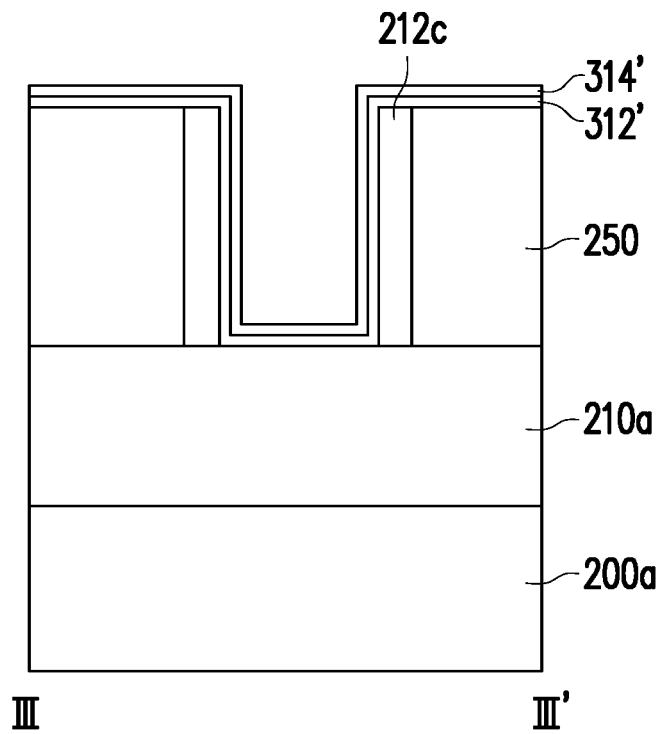

Referring to FIG. 3B, a high-k material layer 314' is conformally disposed on the interfacial oxide material layer 312'. In some embodiments, the high-k material layer 314' has a dielectric constant greater than about 4, greater than about 12, greater than about 16, or even greater than about 20. For example, a material of the high-k material layer 314' may include metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In some alternative embodiments, the high-k material layer 314' may optionally include a silicate such as HfSiO, HfSiON LaSiO, AlSiO, a combination thereof, or a suitable material. In some embodiments, the method of forming the high-k material layer 314' includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like.

Figure 3C:
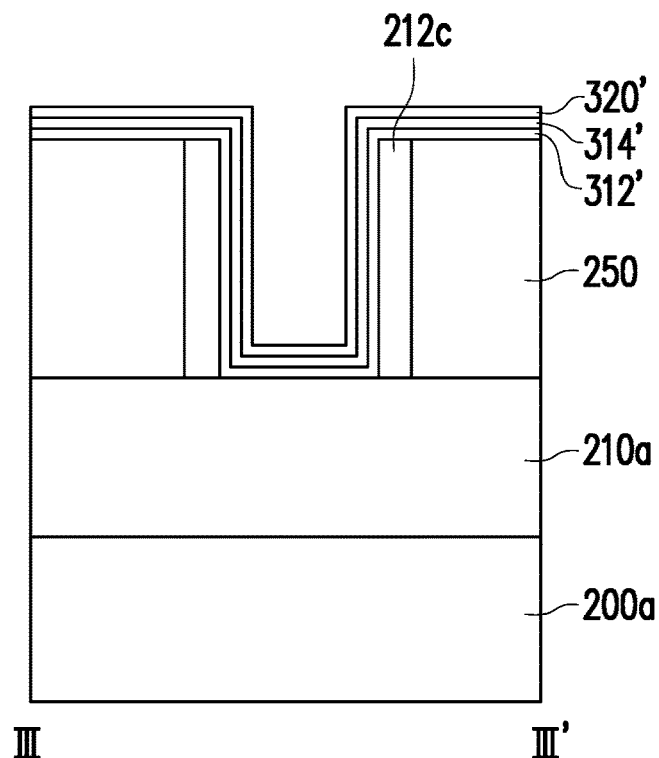

Referring to FIG. 3C, a work function material layer 320' is conformally disposed on the high-k material layer 314'. Exemplary p-type work function metals that may be included in the work function material layer 320' include TiN, TaN, Ru, Mo, Al, WN, $ZrSi_2$, $MoSi_2$, $TaSi_2$, $NiSi_2$, WN, other suitable p-type work function materials, or combinations thereof. On the other hand, exemplary n-type work function metals that may be included in the work function material layer 320' include Ti, Ag, TaAl, TaAlC, TiAlN, TaC, TaCN, TaSiN, Mn, Zr, other suitable n-type work function materials, or combinations thereof. In some embodiments, the method of forming the work function material layer 320' includes performing at least one suitable deposition technique, such as CVD, PECVD, ALD, RPALD, PEALD, MBD, or the like. In some embodiments, the work function material layer 320' or the subsequently formed work function layer 320 (shown in FIGS. 1K, FIG. 2K, and 3F) may serve the purpose of adjusting threshold voltage (Vt) of the FinFET 10.

Figure 3D:
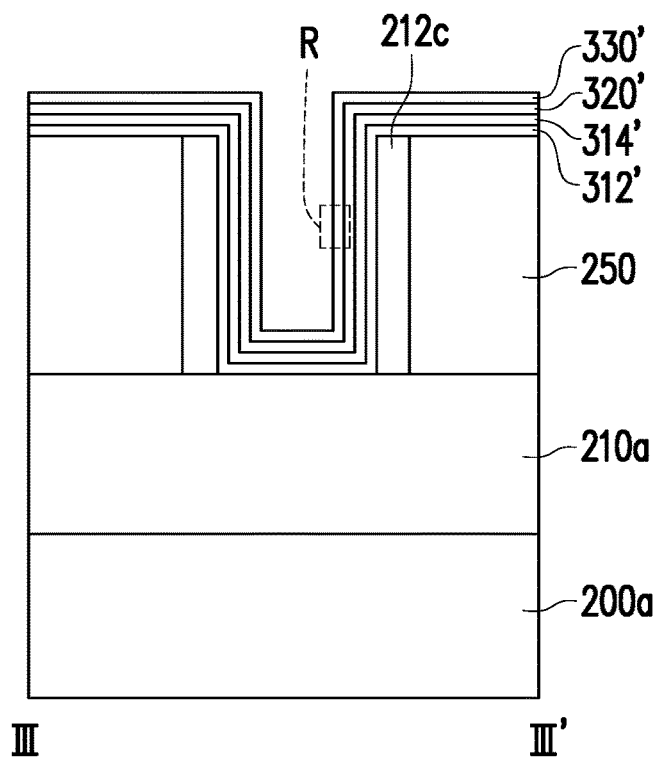
Figure 4A:
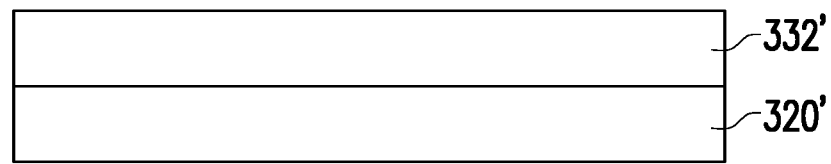
FIG. 4A to FIG. 4D are schematic enlarged views of a region illustrating the method for forming a barrier material layer in the gate structure of the FinFET in FIG. 3D.

Referring to FIG. 3D, a barrier material layer 330' is conformally disposed on the work function material layer 320'. The process for forming the barrier material layer 330' will be described in detail below in conjunction with FIG. 4A to FIG. 4D. FIG. 4A to FIG. 4D are schematic enlarged views of a region R illustrating the method for forming a barrier material layer 320' in the gate structure 300 of the FinFET 10 in FIG. 3D. Referring to FIG. 4A, a first TiN layer 332' is deposited on the work function material layer 320'. In some embodiments, the first TiN layer 332' may be disposed on the work function material layer 320' through atomic layer deposition (ALD). For example, a precursor gas of the first TiN layer 332' may be provided to a surface of the work function material layer 320', so as to deposit the first TiN layer 332' onto the work function material layer 320'. In some embodiments, the precursor gas of the first TiN layer 332' includes Titanium tetrachloride ($TiCl_4$).

Figure 4B:
Figure 4B:
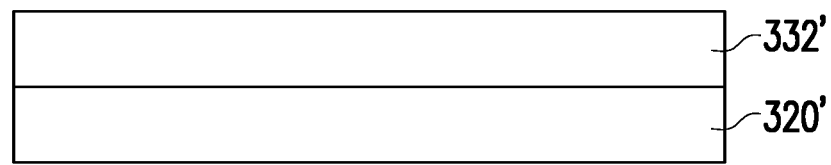

Referring to FIG. 4B, after the first TiN layer 332' is formed to a certain thickness (for example, 10 Å to 15 Å), the precursor gas for the first TiN layer 332' is turned off and purged. Thereafter, a treatment of passing a precursor gas G onto the first TiN layer 332' is performed. In some embodiments, the precursor gas G contains silicon or aluminum. For example, the precursor gas G may include silane ($SiH_4$) or Triethylaluminum ($Al(C_2H_5)_3$). In some embodiments, the treatment may be performed under a thermal condition. For example, the precursor gas G may be passed under a temperature of 400° C. to 450° C. The treatment under thermal condition allows the introduction of silicon atoms or aluminum atoms into portions of the first TiN layer 332' in close proximity to the surface thereof. In some embodiments, the treatment time may range between 10 seconds and 50 seconds and the flow rate of the precursor gas G may be 100 standard cubic centimeter per minute (sccm) to 500 sccm.

Figure 4C:
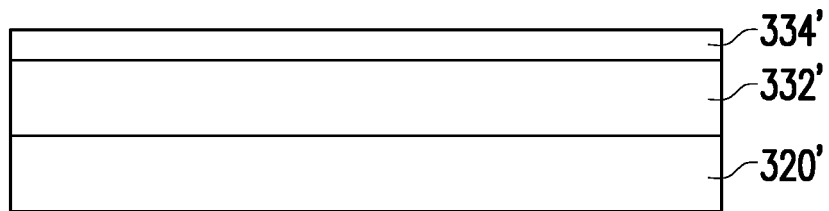

Referring to FIG. 4C, some of the silicon atoms or the aluminum atoms introduced into the first TiN layer 332' may react with the oxygen atoms in the air or the nitrogen atoms in the first TiN layer 332' to form a trapping layer 334' on the first TiN layer 332'. For example, when the precursor gas G is a silicon-containing gas, the trapping layer 334' may include silicon oxide, silicon nitride, or a combination thereof. When the precursor gas G is an aluminum-containing gas, the trapping layer 334' may include aluminum oxide, aluminum nitride, or a combination thereof. In some embodiments, not all of the silicon atoms or aluminum atoms are reacted with the oxygen atoms or the nitrogen atoms. As a result, the first TiN layer 332' may include silicon atoms freely dispersed therein in some embodiments.

Figure 3F:
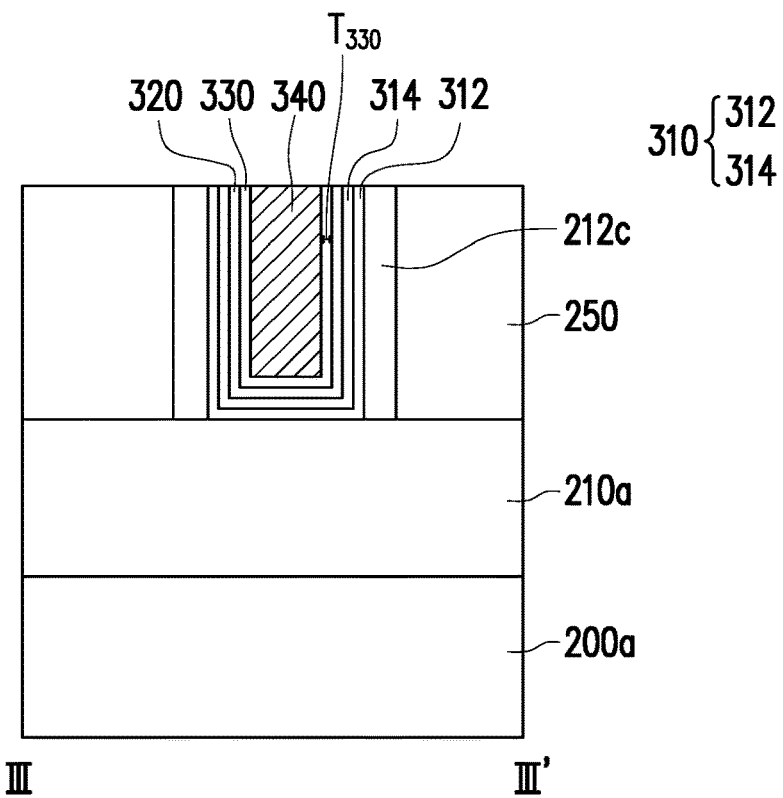
Figure 4D:
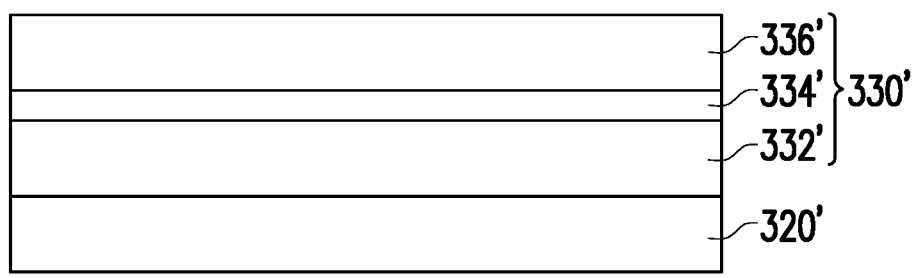

Referring to FIG. 4D, upon the formation of the trapping layer 334', the precursor gas G is turned off and purged. Thereafter, a second TiN layer 336' is formed on the trapping layer 334'. Similar to the first TiN layer 332', the second TiN layer 336' may be formed by performing atomic layer deposition (ALD). The formation method of the second TiN layer 336' is similar to the formation method of the first TiN layer 332', so the detailed description thereof is omitted herein. As illustrated in FIG. 4D, the barrier material layer 330' or the subsequently formed barrier layer 330 (shown in FIGS. 1K, 2K, and 3F) includes the first TiN layer 332', the second TiN layer 336', and the trapping layer 334' sandwiched between the first TiN layer 332' and the second TiN layer 336'.

Figure 3E:
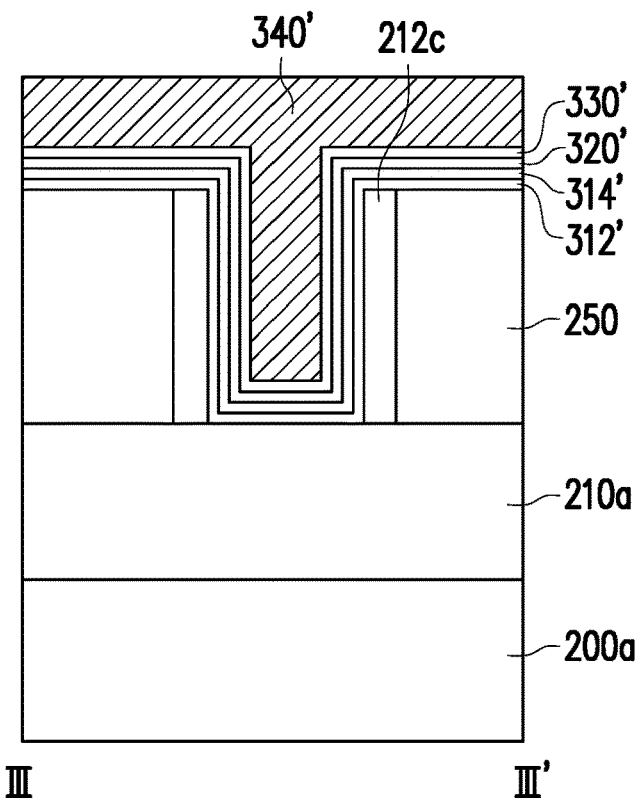

Referring to FIG. 3E, after the barrier material layer 330' is deposited, a metal material layer 340' is formed over the barrier material layer 330' to fill up the remaining hollow portion H. In some embodiments, the metal material layer 340' may include tungsten. A precursor for forming the tungsten metal material layer 340' may include tungsten hexafluoride ($WF_6$) and hydrogen ($H_2$). In some embodiments, the formation of the metal material layer 340' is conducted under a temperature of 300° C. to 400° C.

Referring to FIG. 3E and FIG. 3F, excess layers outside the hollow portion H are removed to form the gate structure 300. In some embodiments, portions of the interfacial oxide material layer 312', portions of the high-k material layer 314', portions of the work function material layer 320', portions of the barrier material layer 330', and portions of the metal material layer 340' outside the hollow portion H are removed by a planarization process to form the interfacial oxide layer 312, the high-k layer 314, the work function layer 320, the barrier layer 330, and the metal layer 340. In some embodiments, the planarization process may include performing a CMP process. In some embodiments, the metal layer 340 may be utilized as a gate electrode. As illustrated in FIG. 3F, the interfacial oxide layer 312, the high-k layer 314, the work function layer 320, and the barrier layer 330 have U-shape cross-sections. The high-k layer 314 is sandwiched between the interfacial oxide layer 312 and the work function layer 320, the work function layer 320 is sandwiched between the high-k layer 134 and the barrier layer 330, and the barrier layer 330 is sandwiched between the work function layer 320 and the metal layer 340. As mentioned above, the precursor gas for forming the metal layer 340 includes $WF_6$. In some embodiments, the fluorine atom in $WF_6$ may be introduced into the metal layer 340 as impurities. During the formation process of the metal material layer 340' or in the subsequent thermal processes, the fluorine atom may diffuse into the work function layer 320, thereby leading threshold voltage (Vt) shift in the device. As a result, the performance of the device is compromised. Nevertheless, as mentioned above, since the barrier layer 330 sandwiched between the metal layer 340 and the work function layer 320 includes silicon or aluminum, the fluorine may be trapped in the barrier layer 330 before diffusing into the work function layer 320. For example, the fluorine atom may react with the silicon of the silicon oxide and the silicon nitride or the aluminum of the aluminum oxide and the aluminum nitride in the trapping layer 334' to form silicon tetrafluoride ($SiF_4$) or aluminum fluoride ($AlF_3$) in the trapping layer 334'. In some alternative embodiments, the fluorine atom may react with the silicon atoms or the aluminum atoms freely dispersed in the first TiN layer 332' to form $SiF_4$ or $AlF_3$. In other words, the fluorine impurities generated during the formation process of the metal layer 340 is trapped inside of the barrier layer 330, and the barrier layer 330 includes fluorine. The barrier layer 330 is able to block the fluorine impurities from diffusing into the work function layer 320, thereby avoiding shift in the threshold voltage. As such, the performance of the FinFET 10 may be ensured. Moreover, since the silicon atoms or the aluminum atoms within the barrier layer 330 are able to trap the fluorine impurities, the barrier layer 330 may be a thin layer while maintaining sufficient blocking function. For example, the barrier layer 330 may have a thickness $T_{330}$ of 10 Å to 30 Å.

The processes illustrate in FIGS. 1J-1K and FIGS. 2J-2K are commonly referred to as a metal replacement process. In some embodiments, the dummy gate structure 212 including polysilicon is replaced by the gate structure 300 which includes metal. Since the dummy gate structure 212 are being replaced by the gate structure 300, subsequent process of forming metallic interconnection (not shown) can be implemented. For instance, other conductive lines (not shown) are formed to electrically connect the metal layer 340 with other elements in the FinFET 10.

It should be noted that the foregoing embodiment adapted FinFET as an example, but the disclosure is not limited thereto. In some alternative embodiments, the steps of forming the gate structure 300 shown in FIGS. 3A-3F and 4A-4D may also be utilized in a planar metal-oxide-semiconductor field-effect transistor (MOSFET).

In accordance with some embodiments of the disclosure, a gate structure includes a gate dielectric layer, a work function layer, a metal layer, and a barrier layer. The work function layer is on the gate dielectric layer. The metal layer is over the work function layer. The barrier layer is sandwiched between the metal layer and the work function layer. The barrier layer includes silicon or aluminum.

In accordance with some embodiments of the disclosure, a fin field-effect transistor (FinFET) includes a semiconductor substrate, a plurality of insulators, a gate structure, and a strained material layer. The semiconductor substrate includes at least one semiconductor fin thereon. The insulators are disposed on the semiconductor substrate. The at least one semiconductor fin is being sandwiched by the insulators. The gate structure is disposed across the at least one semiconductor fin. The strained material covers a portion of the at least one semiconductor fin. The gate structure includes a gate dielectric layer, a work function layer, a metal layer, and a barrier layer. The work function layer is on the gate dielectric layer. The metal layer is over the work function layer. The barrier layer is sandwiched between the metal layer and the work function layer. The barrier layer includes silicon or aluminum.

In accordance with some embodiments of the disclosure, a method of manufacturing a fin field-effect transistor (FinFET) includes at least the following steps. A semiconductor substrate is patterned to form a plurality of trenches in the semiconductor substrate and at least one semiconductor fin between the trenches. A plurality of insulators are formed in the trenches. A dummy gate structure is formed across the at least one semiconductor fin. A strained material is formed over portions of the at least one semiconductor fin revealed by the dummy gate structure. The dummy gate structure is removed to form a hollow portion. A gate dielectric layer, a work function layer, a silicon or aluminum-containing barrier layer, and a metal layer are sequentially formed in the hollow portion to form a gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gate structure, comprising:
a gate dielectric layer;
a work function layer surrounded by the gate dielectric layer;
a metal layer disposed over the work function layer; and
a barrier layer surrounded by the work function layer, wherein the barrier layer surrounds the metal layer, the barrier layer comprises fluorine and silicon, or fluorine and aluminum, and the barrier layer is a tri-layered structure.

2. The gate structure according to claim 1, wherein the metal layer comprises tungsten.

3. The gate structure according to claim 1, wherein the gate dielectric layer comprises:
an interfacial oxide layer; and
a high-k layer on the interfacial oxide layer.

4. The gate structure according to claim 1, wherein a thickness of the barrier layer ranges between 10 Å and 30 Å.

5. The gate structure according to claim 1, wherein the barrier layer comprises:
a first TiN layer;
a second TiN layer over the first TiN layer; and
a trapping layer sandwiched between the first TiN layer and the second TiN layer, wherein the trapping layer comprises silicon oxide, silicon nitride, aluminum oxide, aluminum nitride, or a combination thereof.

6. The gate structure according to claim 5, wherein the trapping layer further comprises silicon tetrafluoride ($SiF_4$) or aluminum fluoride ($AlF_3$).

7. The gate structure according to claim 5, wherein the first TiN layer comprises silicon tetrafluoride ($SiF_4$) or aluminum fluoride ($AlF_3$).

8. A fin field-effect transistor (FinFET), comprising:
a semiconductor substrate having at least one semiconductor fin thereon;
a gate structure disposed across the at least one semiconductor fin, wherein the gate structure comprises:
a gate dielectric layer;
a work function layer surrounded by the gate dielectric layer;
a metal layer disposed over the work function layer; and
a barrier layer surrounded by the work function layer, wherein the barrier layer surrounds the metal layer, the barrier layer comprises fluorine and silicon, or fluorine and aluminum, and the barrier layer is a tri-layered structure; and
a strained material covering a portion of the at least one semiconductor fin.

9. The FinFET according to claim 8, wherein the metal layer comprises tungsten.

10. The FinFET according to claim 8, wherein the gate dielectric layer comprises:
an interfacial oxide layer; and
a high-k layer on the interfacial oxide layer.

11. The FinFET according to claim 8, wherein a thickness of the barrier layer ranges between 10 Å and 30 Å.

12. The FinFET according to claim 8, wherein the barrier layer comprises:
a first TiN layer;
a second TiN layer over the first TiN layer; and
a trapping layer sandwiched between the first TiN layer and the second TiN layer, wherein the trapping layer comprises silicon oxide, silicon nitride, aluminum oxide, aluminum nitride, or a combination thereof.

13. The FinFET according to claim 12, wherein the trapping layer further comprises silicon tetrafluoride ($SiF_4$) or aluminum fluoride ($AlF_3$).

* * * * *